United States Patent [19]
Alexandrov et al.

[11] 4,116,598
[45] Sep. 26, 1978

[54] APPARATUS FOR PRODUCING HIGH-MELTING-METAL-OXIDE-BASED CRYSTALLINE MATERIALS

[75] Inventors: Vladimir Ilich Alexandrov; Vyacheslav Vasilievich Osiko; Vladimir Mikhailovich Tatarintsev; Viktor Timofeevich Udovenchik, all of Moscow, U.S.S.R.

[73] Assignee: Fizichesky Institut Imeni P.N. Lebedeva Akademii Nauk SSSR, U.S.S.R.

[21] Appl. No.: 774,019

[22] Filed: Mar. 3, 1977

Related U.S. Application Data

[63] Continuation of Ser. No. 555,295, Mar. 4, 1975, abandoned.

[51] Int. Cl.$^2$ .............................................. B29D 7/02
[52] U.S. Cl. ............................. 425/174.8 R; 164/251; 164/438; 164/441; 219/10.65
[58] Field of Search ....................... 164/49, 50, 51, 52, 164/89, 251, 252, 86, 87, 88, 438, 441; 425/174.8 R, 78, 79, 404; 264/24, 25; 219/10.41, 10.65, 10.49, 7.5, 10.67

[56] References Cited

U.S. PATENT DOCUMENTS

| | | | |
|---|---|---|---|
| 3,212,142 | 10/1965 | Moritz | 164/89 |
| 3,467,166 | 9/1969 | Getselev et al. | 164/49 |
| 3,496,280 | 2/1970 | Dukelow et al. | 164/252 UX |
| 3,598,168 | 8/1971 | Clark | 164/51 |
| 3,768,543 | 10/1973 | Kolisnyk | 164/252 |

*Primary Examiner*—Francis S. Husar
*Assistant Examiner*—Mark Rosenbaum
*Attorney, Agent, or Firm*—Robert E. Burns; Emmanuel J. Lobato; Bruce L. Adams

[57] ABSTRACT

Apparatus for producing high-melting-metal-oxide-based crystalline materials by melting a charge under the effect of a high-frequency electromagnetic field with the charge melting zone being maintained constant, the charge being loaded continuously and obtained crystalline material being withdrawn also continuously. The apparatus is a cooled mould, whose body is shaped as a truncated cone with an angle between its generatrix and cone height ranging from 2° to 10°, and an induction coil encompassing the body of the cooled mould in the region of location of the constant melting zone.

1 Claim, 3 Drawing Figures

APPARATUS FOR PRODUCING HIGH-MELTING-METAL-OXIDE-BASED CRYSTALLINE MATERIALS

This is a continuation of application Ser. No. 555,295 filed Mar. 4, 1975 and now abandoned.

BACKGROUND OF THE INVENTION

The present invention relates to an apparatus for producing crystalline materials and more particularly to an apparatus for producing high-melting-metal-oxide-based crystalline materials by melting and which may find application in the ceramic industry for manufacturing high-melting-metal-oxide-based high-temperature ceramics.

Different methods of producing high-melting-metal-oxide-based crystalline materials and devices for effecting the methods are known in the art.

Thus, in one of the prior-art methods of producing high-melting-metal-oxide-based crystalline materials adapted for manufacturing high-temperature ceramics a charge comprising high-melting metal oxides is mixed, pressed and subjected to a prolonged annealing at a temperature far below the above melting point of the above oxides.

Also known is a device for effecting the method of producing high-melting-metal-oxide-based crystalline materials. The device is shaped as a flame furnace whose body is made of metal lined inside with ceramics and is furnished with burners intended to feed fuel into the furnace inner space, wherein the charge is exposed to prolonged annealing under the effect of the fuel being burned.

Since the charge is subjected to an irregular effect of a heat field, the thus-obtained crystalline material contains unreacted constituents, this adversely affects the properties of the produced material and is a disadvantage of the above-mentioned procedure. In another known method of producing high-melting-metal-oxide-based crystalline materials by melting, adapted essentially also for manufacturing ceramics based on the above oxides, a charge composed of high-melting metal oxides is, upon mixing, subjected to arc melting.

The known device for effecting the known method is an electric arc furnace whose body is made from metal lined within with ceramics and provided with graphite electrodes between which an arc discharge occurs which melts the charge.

A serious disadvantage peculiar to this method of producing high-melting-metal-oxide-based crystalline materials by melting and to the device for carrying out the method resides in that when graphite electrode are employed some high-melting oxides interact chemically with the electrode material in the course of arc discharge, forming carbides or are reduced to a metal and thus contaminate the crystalline material obtained.

Finally, another known method of producing high-melting-metal-oxide-based crystalline materials by melting, comprises the steps of: loading a charge whose composition incorporates at least one high-melting metal oxide into a cooled mould which is a container, introducing an oxide-forming metal into the loaded charge in amounts providing for the initial melting of the charge and subsequent melting of said charge under the effect of a high-frequency electromagnetic field, with the container being withdrawn together with the molten material out of the zone of action of the high-frequency electromagnetic field and cooled with water, with the crystalline material produced being, on completion of crystallization, cooled in the container and, on being unloaded therefrom, in air.

Also known is a device for effecting the above outlined prior-art method of producing high-melting-metal-oxide-based crystalline materials by melting, comprising a cooled mould with a port for loading the charge, with the mould body being made as a container built up of several copper water-cooled tubes mounted on an insulating plate, spaced at a distance of 1-2 mm from each other and surrounded by an inductor generating a high-frequency electromagnetic field, with a charge-loading means being disposed at the mould port and a means provided for the withdrawal of the crystalline material together with the container.

The thus-obtained crystalline material does not comprise unreacted metal oxides and features a high purity of its chemical composition attributable to the fact that there is no contact whatever between the melt and container walls which are always separated therefrom, owing to water cooling, by a layer of unmelted charge, the so-called wall accretions.

However, one of the essential disadvantages inherent in the known method and device for its realization consists in that the crystalline material obtained does not feature a high degree of homogeneity, this stems from the disadvantages of the crystallization process which takes place in such a container.

Moreover, the apparatus suffers from another disadvantage, i.e. low efficiency related to the inherent design drawbacks of the mould requiring a prolonged multi-stage nature of the process of producing the crystalline material.

SUMMARY OF THE INVENTION

A main object of the present invention is the provision of an apparatus for producing a high-melting-metal-oxide-based crystalline material by melting ensuring the manufacture of a metal-oxide-based crystalline material which not only has high purity of chemical composition but has a high degree of homogeneity.

In accordance with said and other objects, the essence of the invention consists in that the apparatus for producing high-melting-metal-oxide-based crystalline materials by melting, comprises the steps of loading a charge, containing at least one high-melting metal oxide, into a a cooled mould, introducing the loaded charge of an oxide-forming metal in amounts providing for the initial melting of the charge, subsequent melting of the charge accomplished under the effect of a high-frequency electromagnetic field and withdrawing the high-melting-metal-oxide-based crystalline material produced out of the mould. According to the invention, the process of loading the charge and that of withdrawing the obtained crystalline material are carried out continuously and a constant melting zone is maintained during the melting process.

It is expedient that the device for effecting the method comprise a cooled mould whose body is encompassed by an induction coil generating a high-frequency electromagnetic field, a charge-loading means and a means for withdrawing the obtained high-melting-metal-oxide-based crystalline material, in which device, according to the invention, the charge-loading means is made as a gear adapted for continuous loading of the charge. The mould body is shaped as a truncated cone with an angle between the generatrix and cone height ranging from 2° to 10°, and is subdivided along the generatrices into several isolated sections with the inlet for loading the charge being introduced on the side of the smaller bottom of the mould body and the outlet for the withdrawal of the obtained crystalline material on the side of the larger bottom, the induction coil encompasses the mould body in the region of location of the charge melting zone and the means for the withdrawal of the produced crystalline material is a variable-speed gear adapted for regular and continuous conveyance of the produced crystalline material out of the mould.

BRIEF DESCRIPTION OF THE DRAWINGS

The nature of the invention will be clear from the following detailed description of particular embodiments whereof, to be had in conjunction with the accompanying drawings, in which.

DESCRIPTION OF THE PREFERRED EMBODIMENTS

Figure 1:
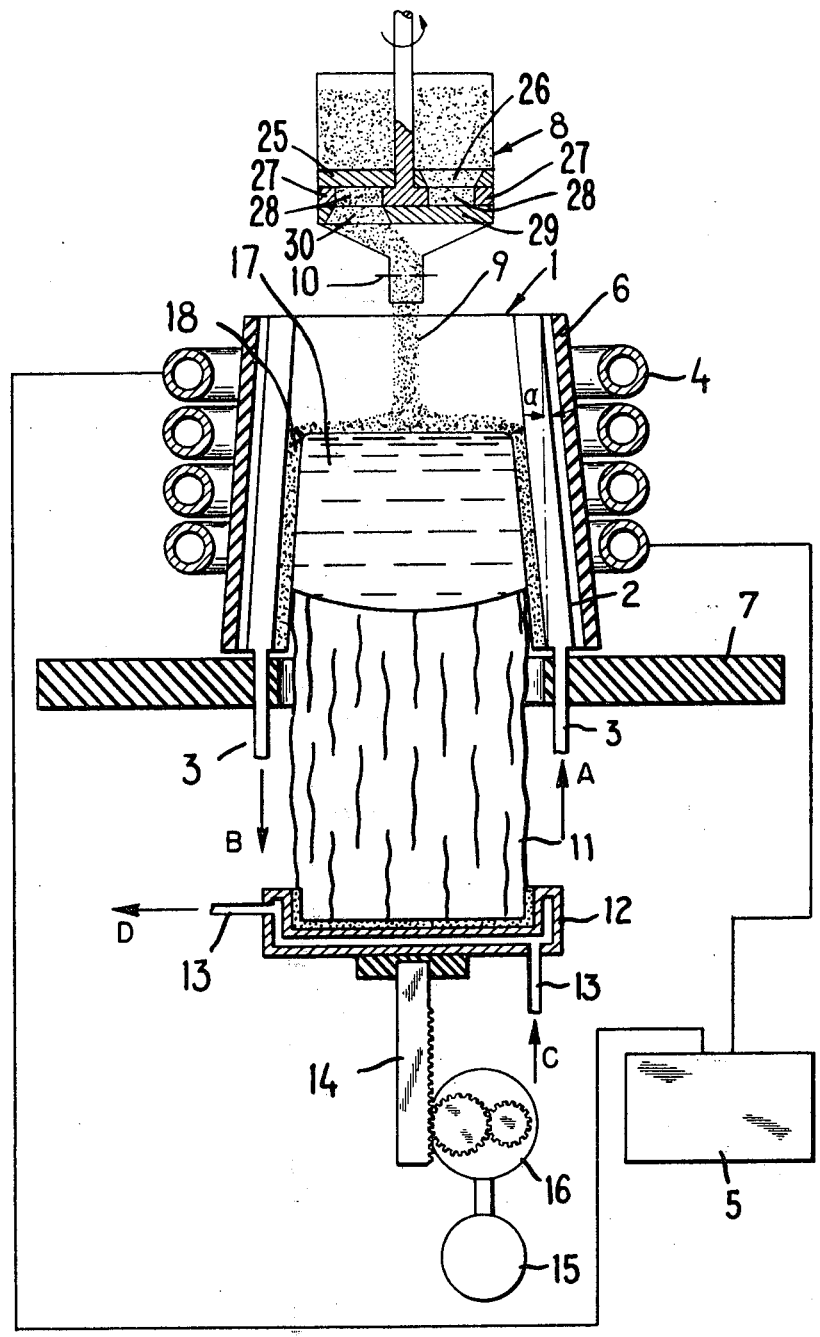
FIG. 1 is a cross-sectional view of a device for producing high-melting-metal-oxide-based crystalline materials by melting, according to the invention.

Considered hereinbelow is a more detailed description of the proposed method of producing high-melting-metal-oxide-based crystalline materials by melting and of the device for carrying out the method.

The herein-proposed apparatus of producing crystalline materials consists in the following.

The charge-loading means loads the charge containing, depending on the chemical composition of the crystalline material being obtained, at least one high-melting metal oxide, into a cooled mould.

As soon as the internal mould space is fully loaded, the metal, forming the above high-melting oxide, is introduced into the charge in amounts providing for the initial melting of the charge.

Melting is accomplished under the effect of a high-frequency electromagnetic field generated by a voltage at an oscillation frequency of at least 300 kHz. At the first moment the energy of this high-frequency electromagnetic field is partly absorbed by the metal, forming the high-melting oxide part of the charge and introduced thereinto. Under the effect of this energy the metal is heated and becomes fluid oxidizing to form a corresponding oxide. In this case the charge disposed in immediate proximity to the metal being fused is heated to a certain temperature and becomes electrically conductive, absorbing in its turn the energy of the high-frequency electromagnetic field and melting therefore. The boundary of the melt moves over the charge involving new sections.

As a result, the melting zone, that is formed, is surrounded by accretions composed of unmelted charge portions coming in contact with cooled mould walls. In the lower part of the mould heat withdrawal results in the crystallization of the boundary layers of the melting zone with the ensuing production of the required high-melting-metal-oxide-based crystalline material. The material is entrained by the withdrawing means and is removed from the mould. In this case the process of withdrawal of the crystalline material is initiated simultaneously with the loading of the charge into the melting zone, with the two steps being carried out concurrently and continuously. A constant melting zone can be maintained just because the quantity of the charge loaded per unit time agrees closely with the amount of the crystalline material being withdrawn.

The device for producing a high-melting-metal-oxide-based crystalline material, comprises a mould 1 (FIG. 1) with a hollow body 2 made from heat-conducting material and cooled from the inside with water fed through pipe branches 3 in the direction shown by arrows A and B. The body 2 is provided with external and internal walls and is shaped as a truncated cone with an angle $\alpha$ between the cone generatrix and its height, shown by a dotted line, ranging from 2° to 10°. The body 2 comprises several isolated sections formed by dividing the body 2 along the generatrices of the truncated cone.

The body 2 is encompassed by an induction coil 4 which is a tubular water-cooled copper spiral forming the output circuit of a high-frequency oscillator 5 generating electromagnetic oscillations. To preclude the possibility of disruptive discharges between the induction coil 4 and mould 1, the latter is surrounded by an insulator 6 matching closely in shape that of the body 2. The insulator 6 can be made either of quartz or of other dielectric of the same class. The sections of the body 2 of the mould 1 are mounted on a base plate 7 made also of an insulating material.

The charge-loading means is shaped as a feed bin 8 which comprises a gear for continuous feed of a charge 9 inside the mould 1, and a diaphragm 10 for adjusting the rate of flow of the charge being loaded. The above means is disposed on the side of the smaller bottom of the body 2. The means for withdrawing the crystalline material being obtained is made as a gear adapted for regular and continuous conveyance of the crystalline material 11 being obtained and comprises a stand 12 in the form of a hollow disc cooled with water flowing along pipe branches 13 in the direction shown by arrows C and D. The upper surface of the stand 12 arranged in the vicinity of the large bottom of the body 2 is adapted to receive the crystalline material 11 being obtained, its lower surface being connected to a gear rack 14 which receives its motion from an electric drive 15 through a reducer 16 which serves to vary and adjust the speed of motion of the rack 14 with the obtained crystalline material 11 thereon. The zone 17 of melting of the charge 9 occupies that portion of a space of the body 2 which corresponds to the location of the induction coil 4. The melting zone 17 is surrounded by accretions 18 composed of the unmelted portion of the charge 9 coming in contact with the cooled walls of the body 2.

Figure 2:
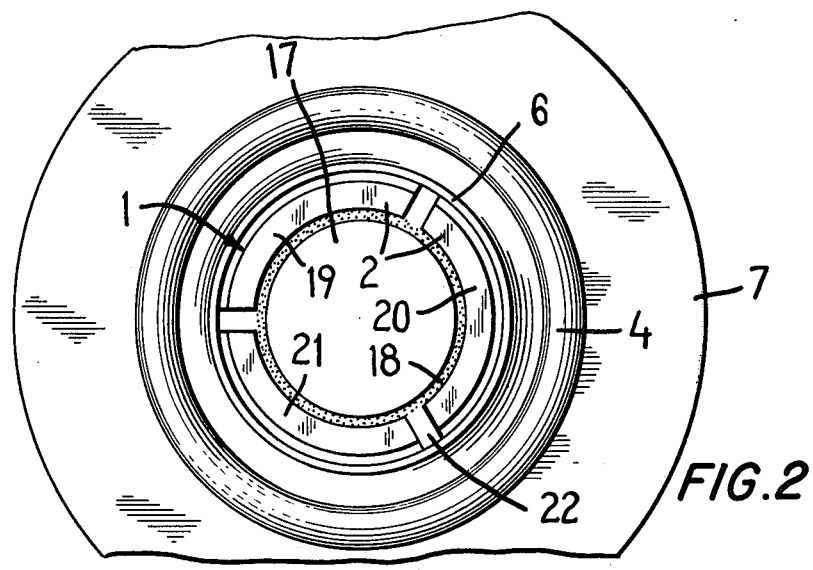
FIG. 2 is a top view of similar device with another embodiment of the mould body, according to the invention.

FIG. 2 shows a top view of the proposed device for producing a high-melting-metal-oxide-based crystalline material by melting, presented in FIG. 1.

In the above embodiment the body 2 (FIG. 2) of the mould 1 comprises three sections 19,20 and 21 isolated from one another by an air gap 22.

Figure 3:
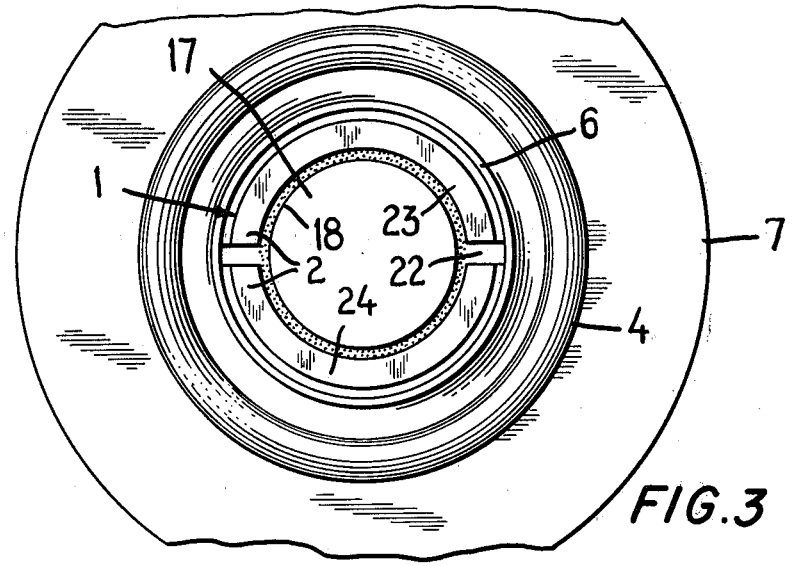
FIG. 3 is a top view of another similar device with a second possible embodiment of the body, according to the invention.

According to another embodiment of the mould 1, illustrated in FIG. 3 (a top view), the body 2 is made up of two sections 23 and 24 also separated by the air gap 22.

The apparatus according to the invention provides for delivering a charge from the bin or hopper B at a rate controlled by a control plate 10. Charge material is delivered by a disc 25 having an opening 26 opening to the interior of a ring 27 so that spaces 28 are filled, the ring 27 is rotationally driven from a central drive shaft as shown. The driven ring is seated on a disc 29 having an opening for delivering the charge material through the control plate 10.

The control or metering of the charge makes it possible to maintain the melt volume constant as a crystallized ingot is withdrawn from the mold. The rate at which the crystallized material is withdrawn is at a rate so that the melt volume is substantially constant since the rate of delivery of the charge material is metered or controlled.

To make the essence of the present invention more fully apparent given hereinbelow are particular examples illustrating the production of high-melting-metal-oxide-based crystalline materials by melting.

EXAMPLE 1

A charge 9 is prepared by mixing pulverized aluminium oxide and silicon dioxide taken in a ratio to agree with the formula of mullite $3Al_2O_3.2SiO_2$.

The prepared charge 9 is first loaded into the feed bin 8 (FIG. 1) and then into the mould 1.

Prior to melting 16.2 g of metallic aluminum and 5.6 g of metallic silicon are introduced locally into the charge 9 loaded into the mould 1.

The charge is melted under the effect of a high-frequency electromagnetic field with the body 2 of the mould 1 being cooled with water fed into the pipe branches 3 and with the base plate 7 being also cooled simultaneously. A power source is the high-frequency oscillator 5 with an operating power of 30 kW and an oscillation frequency of 400 kHz. Upon complete melting of the charge 9, the temperature on the surface of the melting zone 17 is 2100° C. Below the melting zone the melt crystallizes owing to heat withdrawal, whereupon the electric drive 15 is switched on to provide, with the help of the reducer 16, the speed of motion of the stand 12 of 50 cm/hr. Crystalline mullite obtained is removed from the mould 1 at the same speed, with the body 2 of the mould 1 and the stand 12 being all the time cooled with water.

At the same time the charge 9 is continuously added into the melting zone 17 at such a speed that the area occupied by the melting zone 17 remains constant all the time. The crystalline material being obtained is cooled to a temperature of 25° C.

The thus-produced mullite consists of acicular crystals oriented along the temperature gradient vector, with certain crystals being as long as 40 mm. An average porosity of crystalline mullite ranges within 10–20%. The material is free from foreign crystalline phases. Its specific resistance $\rho$ is equal to $9.10^{12}$ ohm.cm at 20° C. and to $4.10^4$ ohm.cm at 1550° C.

EXAMPLE 2

A charge 9 is prepared by mixing pulverized lanthanum and chromic oxides taken in proportion as specified by the formula of lanthanum chromite $LaCrO_3$.

The prepared charge 9 is first loaded into the feed bin 8 and then into the mould 1.

Prior to melting 20 g of preliminary synthetized lanthanum chromite are introduced locally into the mould 1.

Like in the foregoing example, the charge is melted in a high-frequency electromagnetic field with the body 2 of the mould 1 being simultaneously cooled with water. A power source is the high-frequency oscillator 5 with an operating power of 60 kW and an oscillation frequency of 5.28 MHz. After the charge 9 has been completely melted, the temperature on the surface of the melting zone 17 is 2500° C. Next, the electric drive 15 is switched on with the stand 12 being conveyed at a speed of 20 cm/hr (by making use of the reducer 16). The crystalline material being obtained is continuously withdrawn from the mould 1. At the same time the charge 9 is continuously added to the melting zone 17 at such a rate that the melting zone remains all the time constant. The crystalline lanthanum chromite is cooled to 25° C. It is a lustrous black monolith which does not decompose in water and at high temperatures. The material does not contain any foreign phases, its porosity ranges from 17 to 20%. Lanthanum chromite features a n-type conductivity and its specific resistance $\rho$ is $10^2$ ohm.cm at 2000° C.

EXAMPLE 3

The charge 9 comprising mixed pulverized zirconium dioxide and strontium oxide taken in a ratio to agree with the formula of strontium zirconate $SrZrO_3$ are loaded into the mould 1.

Before melting is initiated, 10 g of metallic strontium and 11.3 g of strontium oxide are introduced locally into the charge loaded into the mould 1. Melting is effected in the high-frequency electromagnetic field with the mould 1 being simultaneously cooled with water. A power source is the high-frequency oscillator 5 with an operating power of 25 kW and an oscillation frequency of 10 MHz. After the charge 9 has been completely fused in the mould 1, the temperature of 2800° C. is attained on the surface of the melting zone 17.

Following that, the sequence of operations is similar to that in the foregoing examples, with the exception of the rate of withdrawal of the crystalline material being obtained that amounts to 25 cm/hr.

On completion of the crystallization, the crystalline strontium zirconate is cooled to 25° C.

The thus-obtained strontium zirconate is free from foreign phases and features a porosity of from 17 to 18%.

The specific resistance of strontium zirconate at room temperature amounts to $10^{14}$ ohm.cm and at 1500° C. it is $10^4$ ohm.cm.

The proposed apparatus for producing high-melting-metal-oxide-based crystalline materials may be of particular advantage in such fields of engineering where there is a need in materials featuring high purity of their chemical composition, high degree of homogeneity, high melting point and required electric properties. Moreover, such materials should have adequate refractoriness, high resistance to chemical attack and adequate mechanical strength.

The produced high-melting-metal-oxide-based crystalline materials meet the first requirement, i.e., they feature high purity of their chemical composition, since in the course of their production by melting any interaction between the melting zone 17 and the walls of the body 2 of the mould 1 is ruled out whatever, since the zone 17 of the melt is surrounded by the accretions 18.

A constant melting zone 17 and a continuous nature of the crystallization process promote the production of a crystalline material featuring a high degree of homogeneity and low porosity percentage.

Moreover, high efficiency of the apparatus provides for, in the first place, by the continuous producing of high-melting-metal-oxide-based crystalline materials ensures their wide application on an industrial scale.

Crystalline lanthanum chromite produced by the apparatus is a lustrous black monolith, that is chemically pure, does not decompose in water and at high temperatures and features a n-type conductivity. It is especially well adapted to service in devices converting heat energy into electrical energy.

Such materials as lanthanum chromite and other rare-earth-element chromites produced by the herein-proposed apparatus, owing to their ability to operate in oxidizing atmospheres at a temperature of about 2000° C. can find application in different heating devices.

Thus, a heating element in lanthanum chromite, 4 mm in dia, 60–70 mm long, operates without any troubles in air at a temperature of 2000° C. with the specific resistance of this element $\rho$ ranging from $10^2$ to $10^3$ ohm.cm.

The specific resistance of high-melting-metal-oxide-based crystalline insulating materials (dielectrics) is $10^2$–$10^3$ ohmcm. at 2000° C. Among these are such materials as strontium zirconate, calcium zirconate and spinels which have come into wide use in industry.

In conclusion, it should be noted that articles manufactured from high-melting-metal-oxide-based crystalline materials are employed in metallurgy as proportioners in continuous casters for producing steel and various alloys, as crucibles for manufacturing special-purpose glasses, as lining material in furnaces and in the channels of magnetohydrodynamic generators and as heating elements for resistance furnaces.

We claim:

1. Apparatus for making a high-melting-metal-oxide based crystalline material by melting and crystallizing a part of the melt into the form of an ingot comprising, a continuous feed mechanism for feeding a powder-like crystallizable material, a water-cooled mold having an upper opening for continuously introducing therein a charge of said crystallizable material in a solid state and a bottom opening for removing from said mold a crystalline material subsequent to melting of the charge material and crystallizing thereof, said mold having an upper melting zone for containing molten material charged into the mold in a solid state and a crystallization zone within which the molten material is crystallized, a means defining a movable bottom on said mold closing the bottom of the mold and movable downwardly for withdrawing a solid crystalline ingot from said crystallization zone of said mold directly from below the melting zone, means operatively associated with said bottom to move said bottom downwardly at a rate for withdrawing said ingot downwardly while maintaining a steady state operation in which the volume of melt in said melting zone is maintained substantially constant in conjunction with the rate of feed of the charge by said feed mechanism, an inductive coil about said mold for applying energy of a high frequency electromagnetic field to define said melting zone of said mold, said melting zone constituting a major axial length of said mold, said mold having a body made as a truncated cone with the base of the cone being at the lower end of the mold and with an angle between its generatrix and cone height in a range of from 2° to 10°, a water jacket about said mold for cooling said mold along the axial length thereof to maintain an accretion of unmelted charge material circumferentially of said molten material in said melting zone and an interface of the charge material and the melt circumferentially of the melt, and said mold being divided circumferentially into a plurality of sections electrically insulated one from another.

* * * * *